(12) United States Patent
Carpenter et al.

(10) Patent No.: US 9,437,459 B2
(45) Date of Patent: Sep. 6, 2016

(54) ALUMINUM CLAD COPPER STRUCTURE OF AN ELECTRONIC COMPONENT PACKAGE AND A METHOD OF MAKING AN ELECTRONIC COMPONENT PACKAGE WITH AN ALUMINUM CLAD COPPER STRUCTURE

(71) Applicants: Burton J. Carpenter, Austin, TX (US); Chu-Chung Lee, Round Rock, TX (US); Tu-Anh N. Tran, Austin, TX (US)

(72) Inventors: Burton J. Carpenter, Austin, TX (US); Chu-Chung Lee, Round Rock, TX (US); Tu-Anh N. Tran, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 18 days.

(21) Appl. No.: 14/267,378

(22) Filed: May 1, 2014

(65) Prior Publication Data

US 2015/0318240 A1 Nov. 5, 2015

(51) Int. Cl.
*H01L 21/48* (2006.01)
*H01L 21/56* (2006.01)
*H01L 23/498* (2006.01)
*H01L 23/31* (2006.01)

(52) U.S. Cl.
CPC ......... *H01L 21/4853* (2013.01); *H01L 21/563* (2013.01); *H01L 23/49811* (2013.01); *H01L 23/3128* (2013.01); *H01L 23/49816* (2013.01); *H01L 23/49827* (2013.01); *H01L 23/49866* (2013.01); *H01L 2224/45147* (2013.01); *H01L 2224/48091* (2013.01); *H01L 2224/48228* (2013.01); *H01L 2224/48465* (2013.01); *H01L 2924/15311* (2013.01); *H01L 2924/181* (2013.01)

(58) Field of Classification Search
None
See application file for complete search history.

(56) References Cited

U.S. PATENT DOCUMENTS

| | | | |
|---|---|---|---|
| 2009/0008796 A1 | 1/2009 | Eng et al. | |
| 2011/0089549 A1* | 4/2011 | Zenbutsu et al. | 257/676 |
| 2013/0071686 A1* | 3/2013 | Oda | B23B 15/017 428/652 |
| 2014/0264789 A1* | 9/2014 | Yang et al. | 257/666 |
| 2014/0264835 A1* | 9/2014 | Wang | 257/737 |

OTHER PUBLICATIONS

On. (n.d.) American Heritage® Dictionary of the English Language, Fifth Edition. (2011). Retrieved Jul. 22, 2015 from http://www.thefreedictionary.com/ON.*

(Continued)

*Primary Examiner* — Mohammad Islam
*Assistant Examiner* — Mikka Liu
(74) *Attorney, Agent, or Firm* — David G. Dolezal

(57) ABSTRACT

An electronic component package that includes a package substrate having an aluminum bond pad formed from an aluminum clad copper structure. The aluminum clad copper structure is attached to a dielectric layer. An electronic component is attached to the substrate and includes a conductive structure electrically coupled to the aluminum bond pad. The aluminum bond pad, the electronic component, and at least a portion of the substrate are encapsulated with an encapsulant.

13 Claims, 8 Drawing Sheets

(56) References Cited

OTHER PUBLICATIONS

"Aluminum Inlay Advantages for Wire Bonding Applications", Materion Technical Matters, (http://materion.com/~/media/Files/PDFs/TechnicalMaterials/TechBriefs/Al%20Inlay%20 Advantages%20for%20Wire%20Bonding%20Applications.pdf), downloaded from the internet on Apr. 3, 2014.

"Bond Integrity in Aluminum—Copper Clad Metals", Materion Technical Materials, (http://materion.com/~/media/Files/PDFs/TechnicalMaterials/Bond%20Integrity%20in%20Aluminum-Copper%20Clad%20Metals.pdf), downloaded from the internet on Apr. 3, 2014.

"Wire Bondable Materials—Aluminum Inlay", Materion Technical Materials, (http://materion.com/Products/CompositeAndCladMetals/InterconnectSystemsCladAndPlated/WirebondableMaterialsAluminumInlay.aspx), Apr. 3, 2014.

"Wire Bonding Leadframes", Materion Technical Materials, (http://materion.com/Products/CompositeAndCladMetals/WireBondingLeadframes.aspx), Apr. 3, 2014.

"Thick Metal Cladding on High Frequency Laminates", Rogers Corporation, Advanced Circuit Materials Division, www.rogerscorp.com, downloaded from the internet on Apr. 3, 2014.

"Stamping of Aluminum Inlaid Copper Leadframe for the Automotive Industry", G&M Manufacturing Corporation, (http://www.gandm.com/stamping-aluminum-inlaid-copper-leadframe-automotive-industry.html), Apr. 3, 2014.

"An Evaluation of Aluminum Wire Bondable Surfaces for Automotive Lead Frame Application", 37th International Symposium on Microelectronics, Nov. 14-18, 2004.

"Copper clad aluminum pcb fr4 copper clad laminate pcb pcb recycling machine", Alibaba.com, (http://www.alibaba.com/product-detail/copper-clad-aluminium-pcb-fr4-copper_1749039433.html), downloaded from the internet on Apr. 3, 2014.

\* cited by examiner

ALUMINUM CLAD COPPER STRUCTURE OF AN ELECTRONIC COMPONENT PACKAGE AND A METHOD OF MAKING AN ELECTRONIC COMPONENT PACKAGE WITH AN ALUMINUM CLAD COPPER STRUCTURE

BACKGROUND OF THE INVENTION

1. Field of the Invention

This invention relates in general to electronic component packages and more specifically to aluminum clad copper structures for electronic component package substrates.

2. Description of the Related Art

Electronic component packages may include package substrates. With some packages, one or more die or other types of electronic components are attached to the package substrate and encapsulated with an encapsulant. A package substrate is a structure of an electronic component package that includes electrically conductive structures for carrying electrical signals of an electronic component and dielectric material for providing support and electrical isolation for the electrically conductive structures. In some examples, wirebonds are used to electrically couple the electronic component bond pads to substrate bond pads.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

A package substrate is disclosed that includes an aluminum clad copper pad formed from a layer of aluminum clad copper. The package substrate includes a dielectric layer with aluminum clad copper bond pads. The aluminum clad copper bond pads are formed from a layer of aluminum clad copper that is attached to the dielectric layer. Conductive structures of the package substrate are defined by processes that include forming openings in the aluminum clad copper layer. Such processes may include drilling holes through the aluminum clad copper layer or etching material of the aluminum clad copper layer. In some embodiments, the aluminum may be etched separately from the copper or may be etched together with the copper. The aluminum of the aluminum clad copper provides for a wire bondable surface.

Figure 1:
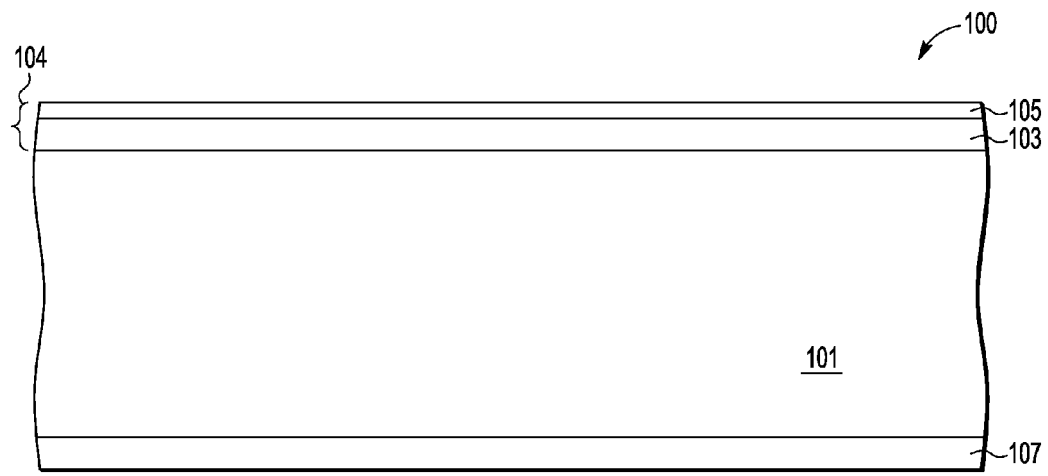
FIGS. 1-7 set forth partial side views of various stages in the manufacture of an electronic component package according to one embodiment of the present invention.

FIGS. 1-7 set forth partial side views of various stages in the manufacture of an electronic component package according to one embodiment of the present invention. FIG. 1 is a partial side view of a package substrate. Substrate 100 includes a dielectric layer 101. In one embodiment, dielectric layer 101 is made of an organic material such as e.g. epoxy, plastic, FR-4, FR-5, a Bismaleimide-Triazine resin, a fiberglass reinforced epoxy laminate, polytetrafluorethylene, other types of organic material, or combinations thereof. However, dielectric layer 101 may be formed of other types of dielectric material e.g. such a ceramic material.

An aluminum clad copper layer 104 is attached to one side of dielectric layer 101 and a copper layer 107 is attached to another side of layer 101. Aluminum clad copper layer 104 includes an aluminum layer 105 that is bonded to a copper layer 103 by a rolling, cold rolling, or cladding process.

In one embodiment, layer 104 and layer 107 are attached to dielectric layer 101 by a lamination process. In one example of a lamination process, layer 104 and layer 107 are stacked with layer 101, which is in a partially cured state. The stacked layers are then subjected to heat and pressure (e.g. at 180 C. and 2-3 mega Pascals) wherein layers are bonded together. However, the layers may be attached by other lamination process or other types of processes (e.g. with an adhesive) in other embodiments. In some embodiments, layer 107 may be an aluminum clad copper layer. Still in other embodiments, substrate 100 may not include layer 107. In other embodiments, substrate 100 may include other layers such as e.g. an internal ground plane (not shown).

In one embodiment layer 101 is 100 microns thick, layers 103 and 107 are 12 microns thick, and layer 105 is 5 microns thick. However, these layers may have other thicknesses in other embodiments. For example, in some embodiments, aluminum layer 105 has a thickness in the range of 0.5-10 microns and layer 103 has a thickness in the range of 5-75 microns.

As referred to herein, a "copper" layer or other type of "copper" structure refers to a layer or other type of structure that is predominantly made of copper (e.g. greater than 85% copper by atomic percentage). For example, in some embodiments, the atomic percentage of copper in layer 103 may be 99.0% or greater. As referred to herein, an "aluminum" layer or other type of "aluminum" structure refers to a layer or other type of structure that is predominantly made of aluminum (e.g. greater than 85% aluminum by atomic percentage). For example, in some embodiments, the atomic percentage of aluminum in layer 105 may be in the range of 95-100%.

Figure 2:
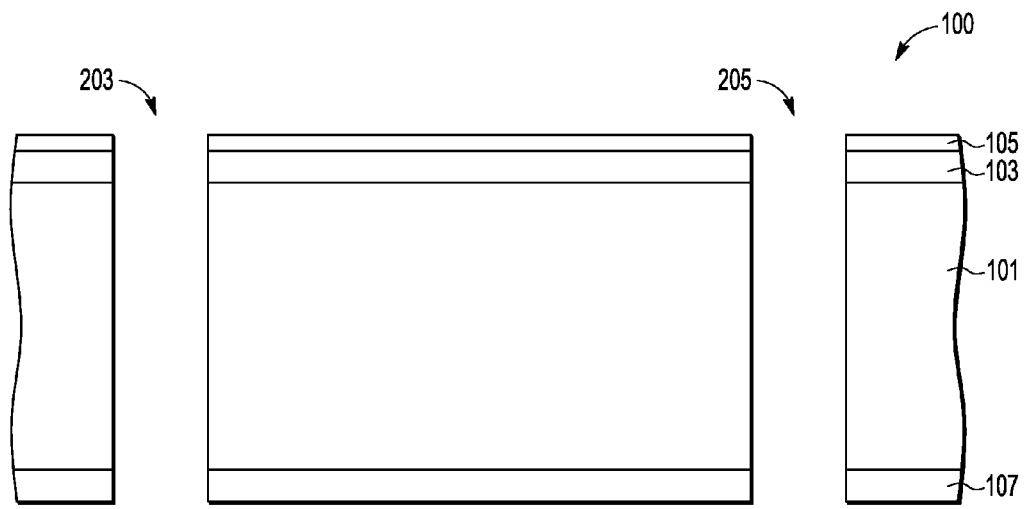

FIG. 2 is a partial side view of package substrate 100 after vias 203 and 205 are formed in substrate 100. In one embodiment, the vias are formed by mechanically drilling into substrate 100. However, the vias may be formed by other methods such as e.g. laser drilling, punching or etching. In one embodiment, the vias have a width in the range of 50-200 microns, but may be of other widths in other embodiments.

Figure 3:
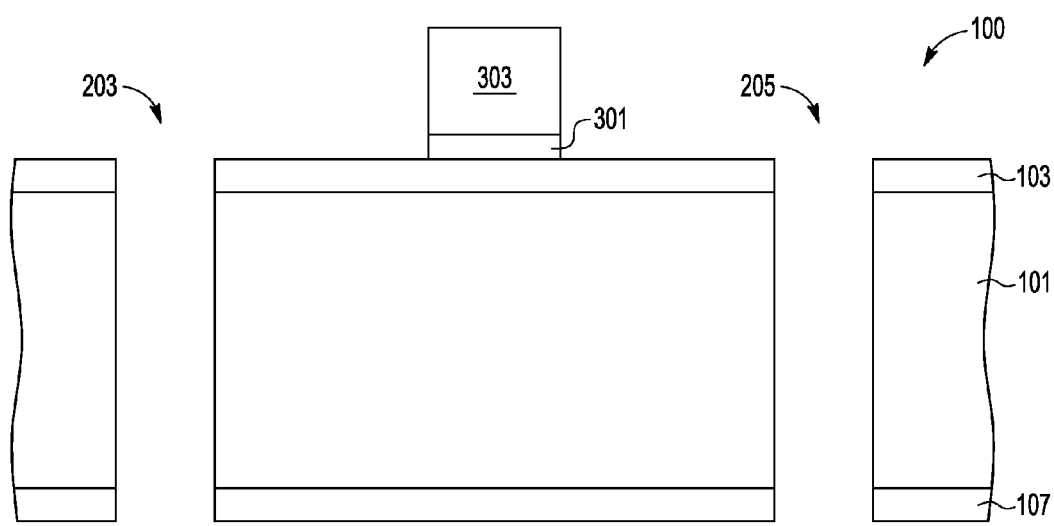

FIG. 3 shows a partial side view after aluminum pad 301 is formed by selectively etching aluminum layer 105. In one embodiment, a mask 303 (e.g. formed from a patterned photo imagable polymer material) is formed over layer 104. Layer 105 is then subjected to an etchant (e.g. an etch chemistry that includes NaOH, KOH, or Tetramethylammonium hydroxide) that is selective to the aluminum but not selective to copper (i.e. the etchant selectively etches aluminum but not copper or the etch rate for copper is significantly less than the etch rate for aluminum) to etch the aluminum in areas exposed by mask 303. In some embodiments, the aluminum may be selectively etched prior to via formation (as shown in FIG. 2).

Figure 4:
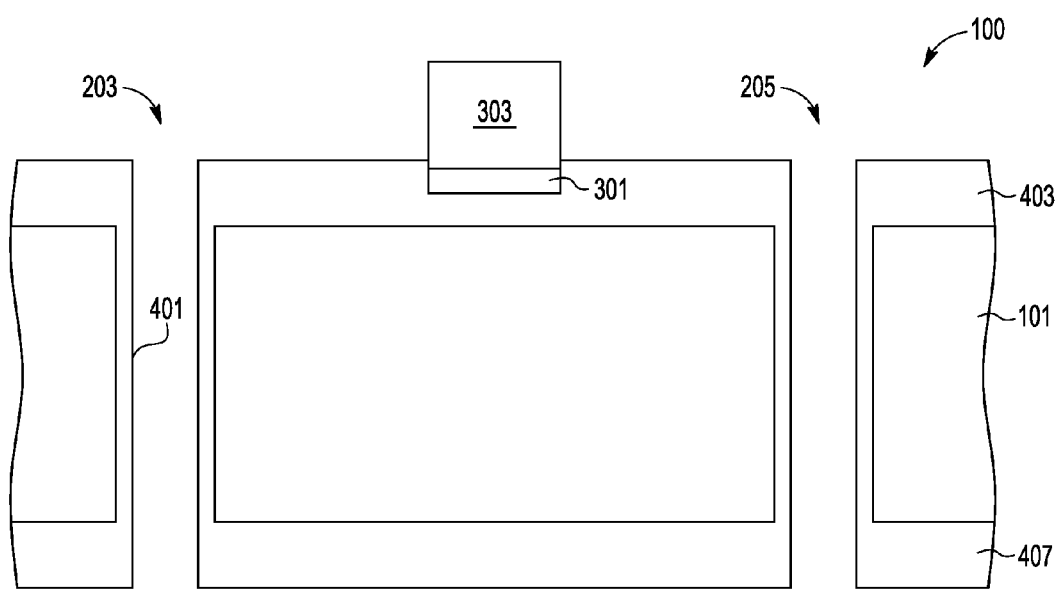

FIG. 4 shows a partial side view of substrate 100 after vias 203 and 205 have been plated with copper material 401. In one embodiment, copper material 401 is deposited by an electroplating process wherein copper material 401 is formed on the sidewalls of vias 203 and 205 as well as formed on exposed portions of layers 103 and 107 to increase the thickness of those layers. In FIG. 4, layers 403 and 407 include layers 103 and 107 with additional plated copper material. In other embodiments, other processes may be used to deposit conductive material on the via side walls. In one embodiment, the thickness of the plated material is approximately 10 microns, but may be of other thicknesses in other embodiments. In one embodiment, layers 104 and/or 107 may be reduced in thickness (for example by etching, polishing or grinding) prior to depositing copper materials 401.

Figure 5:
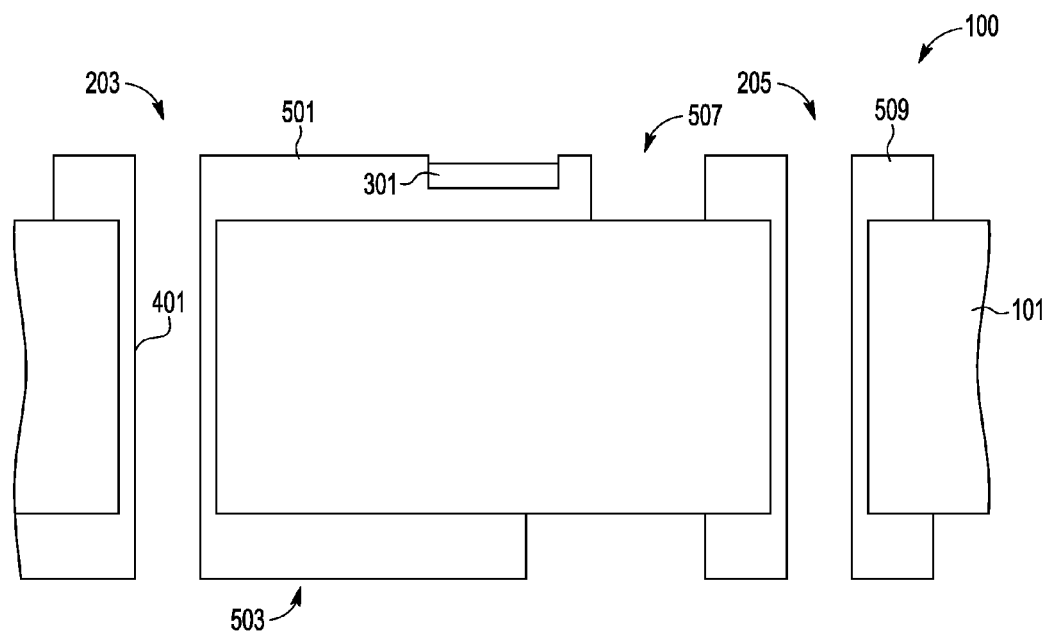

FIG. 5 shows a partial side view of substrate 100 after the copper layers 403 and 407 are patterned to form conductive structures. In one embodiment, conductive structures include ball bond pads 503, conductive traces 501, and plated vias 509. Other types of conductive structures may be formed in other embodiments.

In one embodiment, the conductive structures are formed by forming a patterned mask (not shown) and subjecting the copper to an etchant (e.g. cupric chloride) that etches the copper but not the dielectric material. In one embodiment, the mask is made of a photo imagable polymer material, but may be made of other materials in other embodiments.

Figure 6:
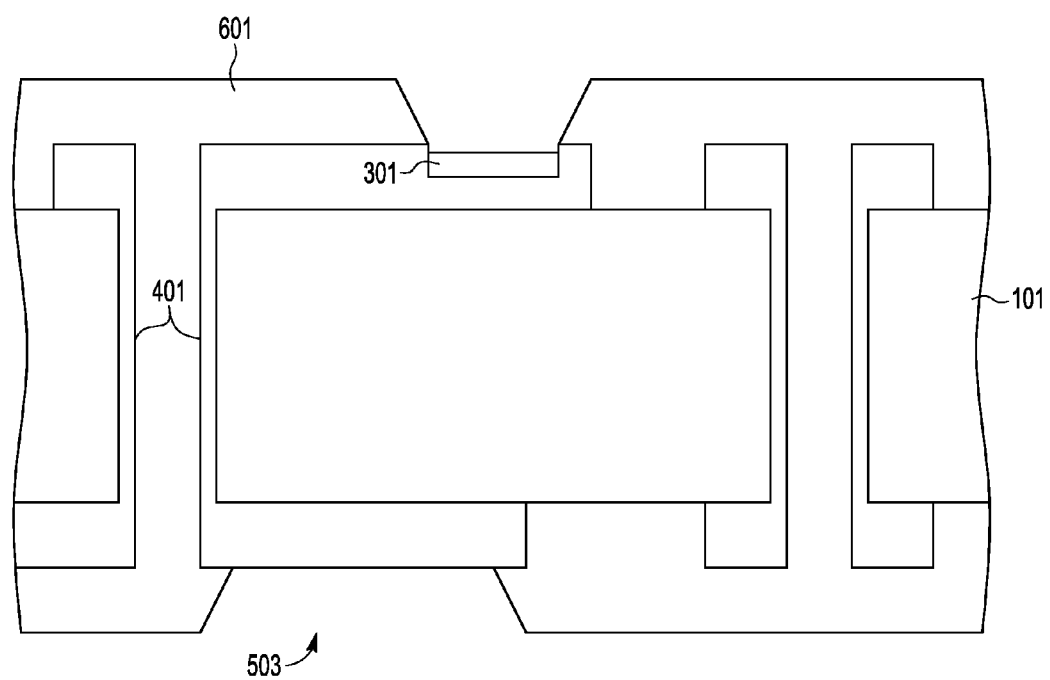

FIG. 6 shows a partial side view of substrate 100 after a solder mask 601 is formed on substrate 100. In one embodiment, the solder mask is formed of a deposited photo active material that can be selectively removed by selectively subjecting portions of the deposited material to UV light. However, a solder mask may be formed of other materials and/or by other processes in other embodiments. In the embodiment shown, openings are formed in solder mask 601 to expose pad 301 and pad 503.

Figure 7:
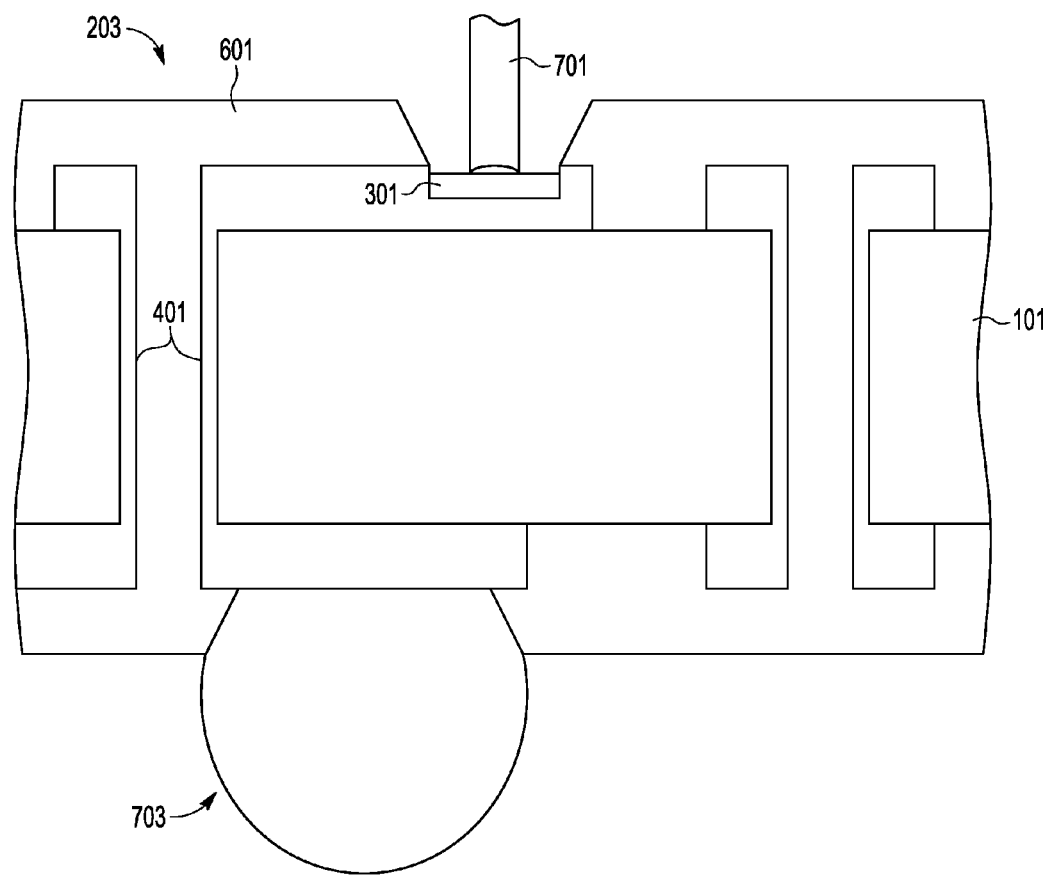

FIG. 7 is a partial side view of substrate 100 after wires (e.g. 701) and solder balls (e.g. 703) are attached to the substrate. In the embodiment shown, a wire 701 is stitch bonded to aluminum pad 301. The other end of wire 701 is ball bonded to a bond pad of an integrated circuit die or other type of electronic component (not shown) which was previously attached to another area of substrate 100. In another embodiment, the wire is ball bonded to aluminum pad 301 on the package substrate, and stitch bonded to a bond pad of an integrated circuit die or other type of electronic component. In one embodiment, wire 701 is a palladium clad copper wire, but may be made of other materials in other embodiments (e.g. gold, copper, aluminum, silver).

In some embodiments, the die may be attached to the package substrate in an active side down configuration where pads of the die are electrically bonded to aluminum pads of the substrate as part of the die attachment process.

In some embodiments, after the attachment of the electronic component and after the wirebonding process, the top side of substrate 100 (including pads (e.g. 301)), die, and wire bonds (e.g. 701) are encapsulated with an encapsulant (not shown). Afterwards, the solder balls (703) are attached. In the embodiment shown, solder ball 703 is electrically coupled to pad 301 via the copper material 401 on the side wall of via 203. In one embodiment, the electronic component may be an integrated circuit die (such as a controller, processor, memory, analog circuit, MEMs die), or other types of electronic component (e.g. a standalone capacitor, resistor, inductor, or transistor).

In some embodiments, substrate 100 includes multiple package sites where each package site includes at least one electronic component attachment area with an electronic component attached thereto, multiple aluminum bond pads (e.g. 301) each electrically coupled to an electronic component by a wire, and multiple solder balls pads each with an attached solder ball (703). In some embodiments, after attachment of the solder balls (703), the substrate 100 and attached structures are singulated into multiple electronic component packages, each with one or more encapsulated electronic components. However, electronic component package maybe formed by other processes and/or have other structures in other embodiments. In some embodiments, the substrates may be singulated prior to die attachment. Other processes that may be performed include singulation, testing and inspecting.

Figure 8:
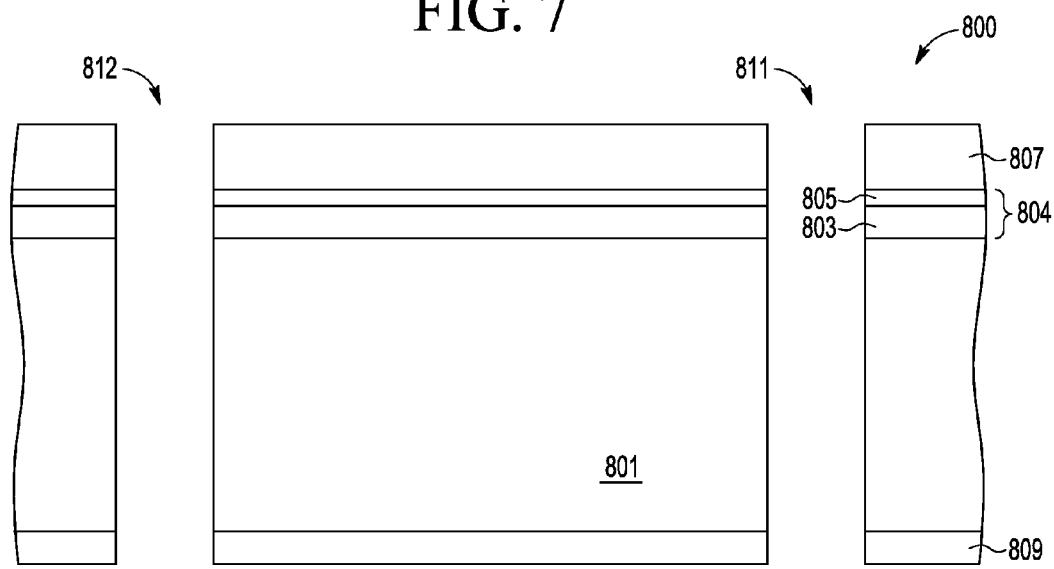
FIGS. 8-12 set forth partial side views of various stages in the manufacture of an electronic component package according to another embodiment of the present invention.

FIGS. 8-12 set forth partial side views of various stages in the manufacture of an electronic component package according to another embodiment of the present invention. Substrate 800 includes dielectric layer 801, a copper layer 809, and an aluminum clad copper layer 804 that includes copper layer 803 and aluminum layer 805. These layers may be similar to layers 101, 107, 104, 103, and 105, respectively. In the embodiment of FIG. 8, a plating mask layer 807 is formed over layer 805. In one embodiment, layer 807 is made of a photo imagable polymer material but may be made of other materials in other embodiments. After the formation of layer 807, vias 812 and 811 are formed through substrate 800 e.g. by mechanical drilling, laser drilling, punching or etching.

Figure 9:
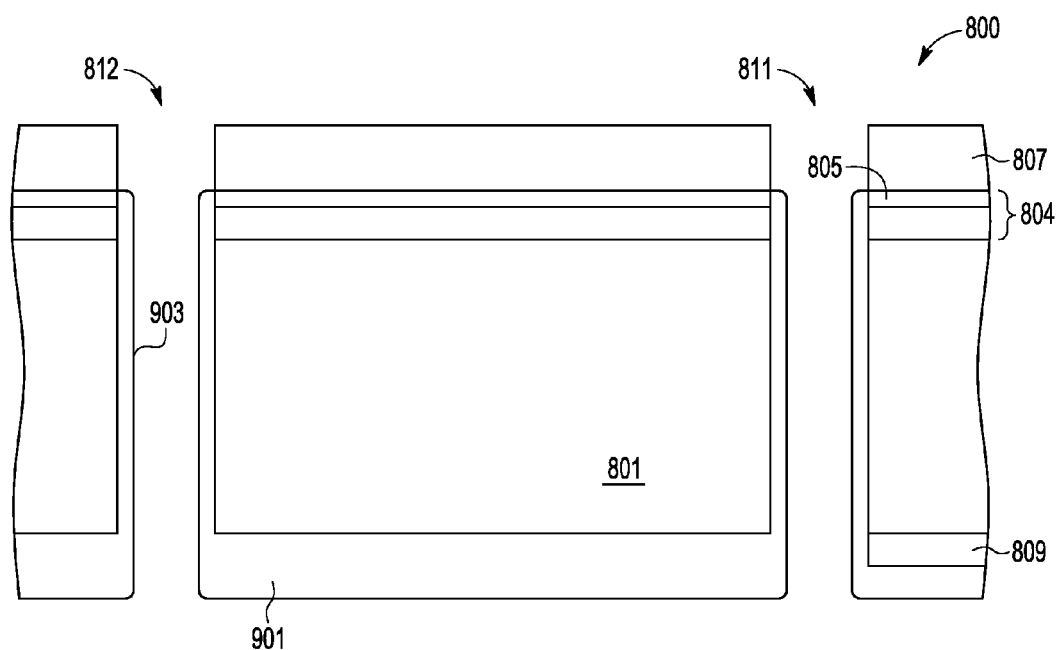

FIG. 9 is a partial side view of substrate 800 after copper is plated on the sidewalls of the vias (e.g. copper material 903) and on exposed portions of layer 809 to increase its thickness (shown as copper layer 901). Mask layer 807 prevents copper from being plated on top of aluminum layer 805. After the plating process, mask layer 807 is removed. In some embodiments, layer 807 may be removed from portions of layer 805, wherein those portions are then plated during the plating process.

Figure 10:
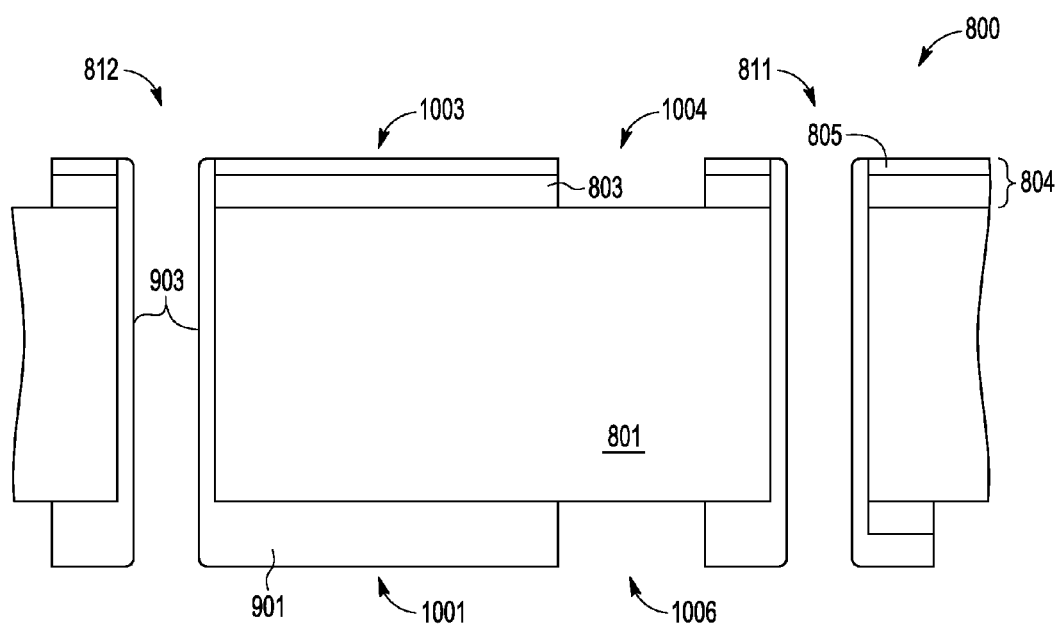

FIG. 10 shows a partial side view of substrate 800 after layer 804 and layer 901 are patterned to form openings (e.g. 1004, 1006) to define electrically conductive structures. In the view shown, layer 804 is patterned to form aluminum bond pad 1003 and layer 901 is patterned to form solder ball pad 1001. Pad 1003 and pad 1001 are electrically coupled by copper material 903 on the side wall of via 812.

Figure 11:
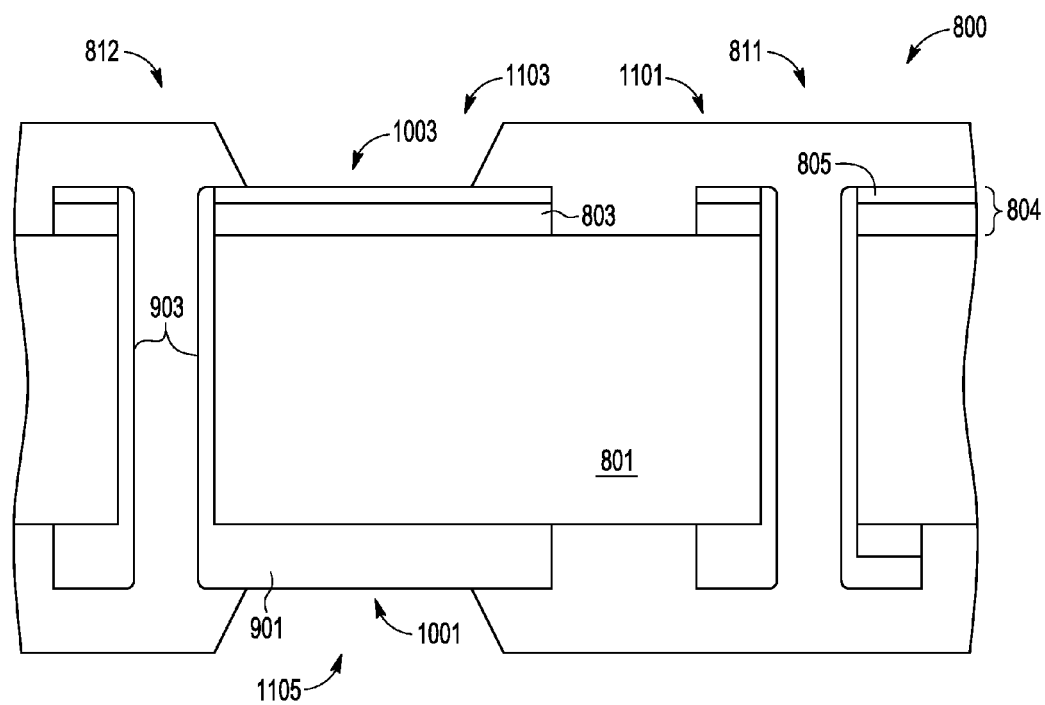

FIG. 11 shows a partial side view of substrate 800 after a solder mask 1101 is formed on substrate 800. Solder mask 1101 includes opening 1103 to expose pad 1003 and opening 1105 to expose pad 1001.

Figure 12:
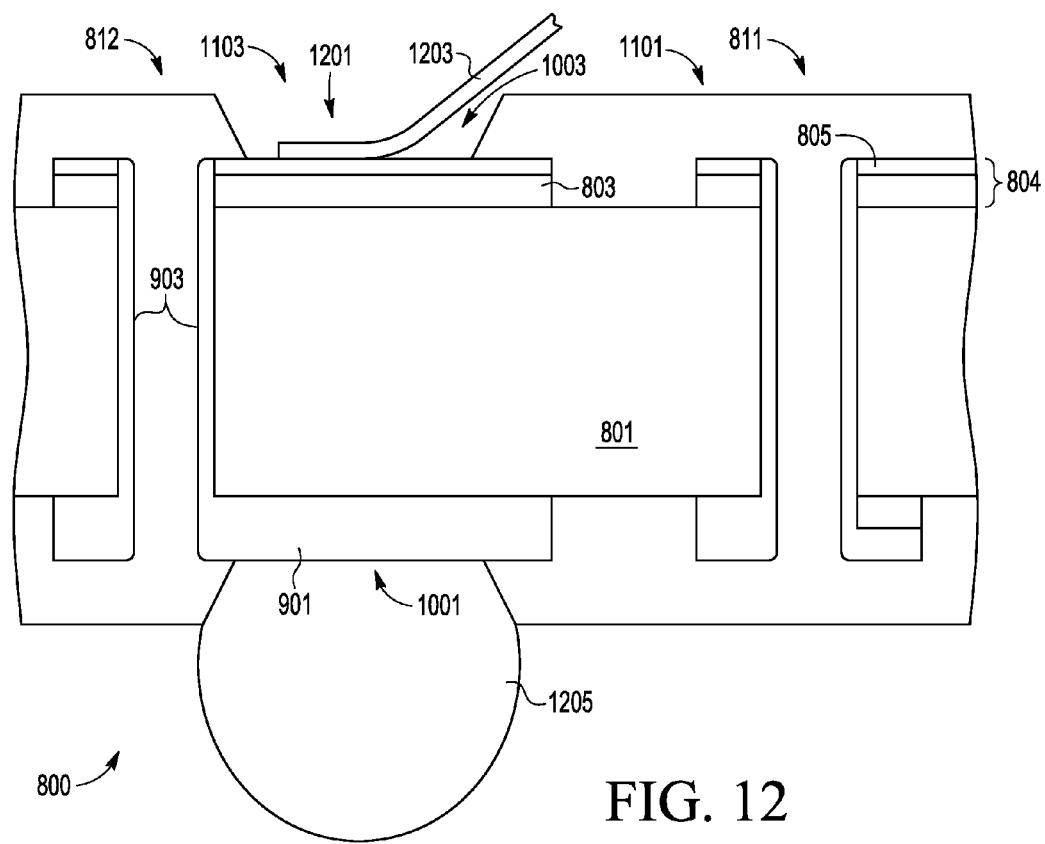

FIG. 12 shows a partial side view of substrate 800 after electronic component attachment, wirebonding, encapsulation, and solder ball attachment. In the view shown, wire 1203 is stitch bonded to pad 1003. The other end of wire 1203 is ball bonded to an electronic component (not shown). The orientation of the stitch wire bond 1201 is rotated by 90 degrees with respect to the orientation of the wire bond shown in FIG. 7. In another embodiment, the wire is ball bonded to aluminum pad 1003 on the package substrate, and stitch bonded to a bond pad of an integrated circuit die or other type of electronic component. The top side of substrate 800 (including pad 1003), wire 1203, and the electronic component (not shown) are encapsulated in an encapsulant (not shown). Afterwards, solder balls (1205) are attached. After the attachment of the solder balls, substrate 800 and the attached structures are singulated into multiple integrated circuit die.

Figure 13:
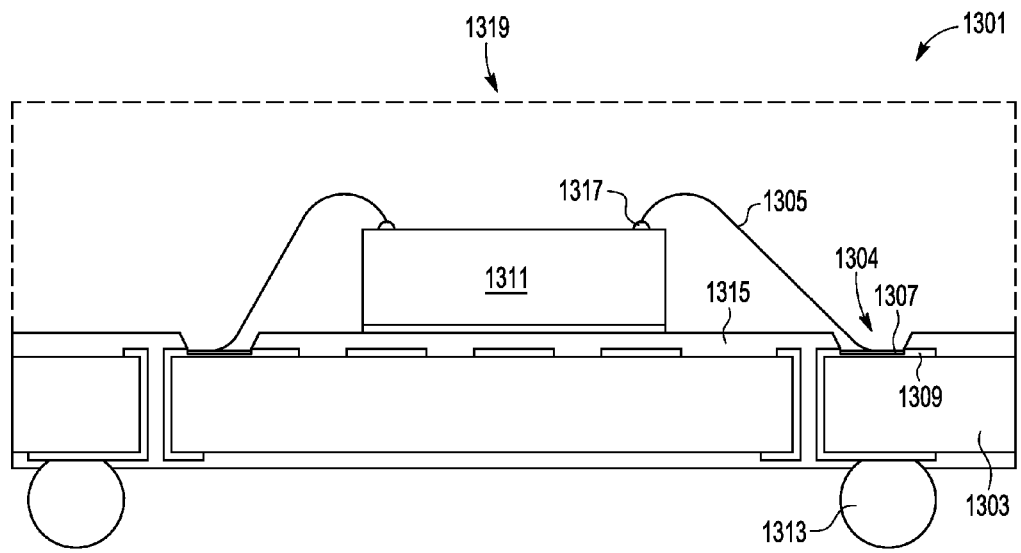
FIG. 13 is a cross sectional side view of an electronic component package according to one embodiment of the present invention.

FIG. 13 shows a cross sectional side view of an electronic component package after singulation. Package 1301 includes an electronic component (die 1311) attached to solder mask 1315. Substrate 1303 includes a wire bond pad 1304 with an aluminum layer 1307 on a copper layer 1309. Bond pad 1304 is electrically coupled by a wire 1305 that is also ball bonded (with ball bond 1317) to a die bond pad of die 1311. Bond pad 1304 is electrically coupled to solder ball 1313. Die 1311, wires 1305, and the top side of substrate 1303 are encapsulated with encapsulant 1319 (shown with dashed lines). In one embodiment, bond pad 1304 is formed from an aluminum clad copper layer (e.g. similar to layer 104) by the processes set forth in FIGS. 1-7. However, pad 1304, may be formed by other processes (e.g. the processes of FIGS. 8-13) in other embodiments. In the embodiment shown, electronic component package is a BGA package. However, electronic component packages may have other configurations e.g. such as a package wherein the die 1311 and solderballs 1313 are located on the same side of substrate 1303. In one embodiment, die 1311 may be located in a cavity formed in substrate 1303. In one embodiment, the package may be a Land Grid Array (LGA) package.

Providing an aluminum bonding surface for a package substrate may provide the package substrate with a more wirebondable surface than a copper surface and a less expensive bonding surface than a nickel gold plated surface of some conventional package substrates. Providing bond pads formed from an aluminum clad copper layer may provide for a package substrate that has aluminum bonding surfaces formed by an economically feasible process. Using an aluminum on copper layer for forming a bond pad may provide for a bond pad structure that has both an aluminum bonding surface and a copper layer that is integral with copper electrical traces of a package substrate, thereby providing for a low resistance electrical path for conducting signals of an electronic component of the package.

Figure 14:
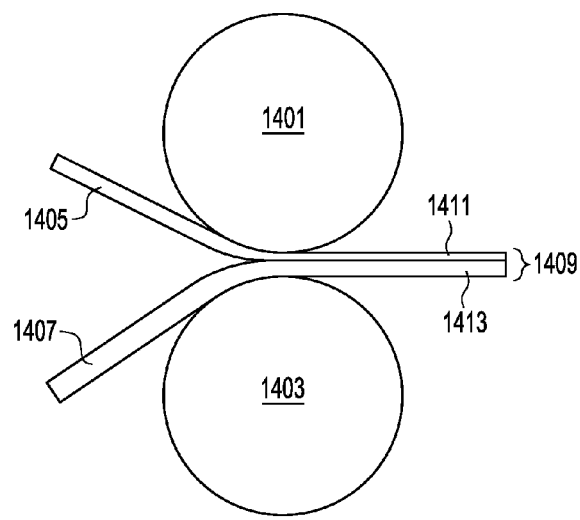
FIG. 14 is a view showing the formation of an aluminum clad copper layer according to one embodiment of the present invention.
Figure 15:
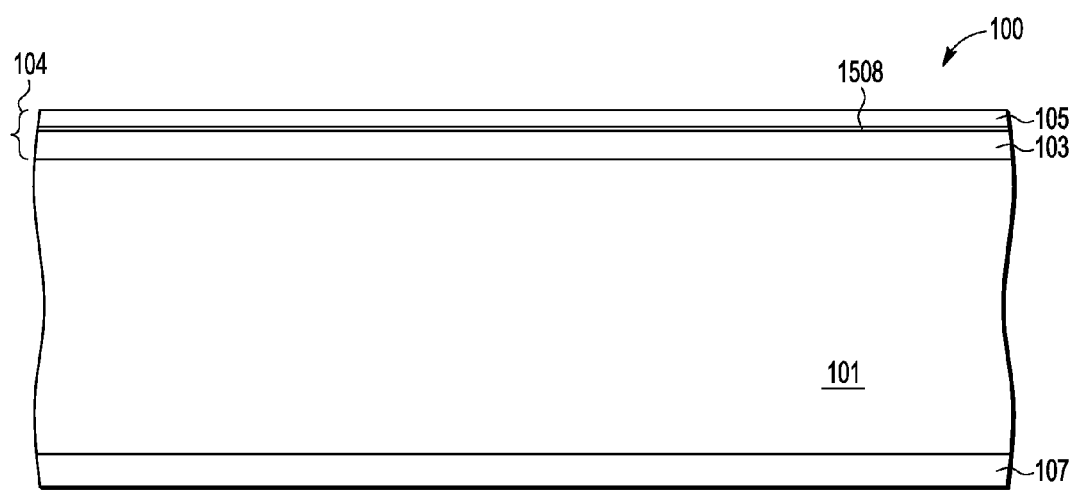
FIG. 15 sets forth a partial side view of a stage in the manufacture of an electronic component package according to another embodiment of the present invention.

FIG. 14 shows a view of a rolling process for forming an aluminum clad copper layer according to one embodiment of the present invention. In the embodiment shown, an aluminum layer 1405 and a copper layer 1407 are fed between rollers 1401 and 1403 which apply a pressure on the layers to form an aluminum clad copper layer 1409. This pressure acts to form a metallurgical weld between the aluminum and copper layers. This metallurgical weld provides for a strong adhesion strength bond between the two layers. The pressure provided by rollers 1401 and 1403 reduces the combined thickness of layers 1405 and 1407 to a lesser thickness of layer 1409 (e.g. by 60% in some embodiments). In some embodiments, this bonding process would be performed at an elevated temperature (e.g. 600° C.). In one embodiment, the rollers provide a bonding force of 200 tons on the layers. Other processes may be performed in forming the aluminum clad copper layer e.g. cleaning and oxide removal of the bonding surfaces prior to bonding. In some embodiments, the copper and aluminum layers maybe stacked together prior to being fed through rollers 1401 and 1403. In some embodiments, layer 1409 may be annealed after the welding process. In some embodiments, the bonding process may be referred to as a cold roll bonding process. In some embodiments, the combined layer 1409 is stored on rolls or large plates that are subsequently cut to form pieces of a size to be attached to a dielectric substrate during a lamination process. In other embodiments, an aluminum clad copper layer maybe formed by other cladding processes. In some embodiments, a barrier layer 1508 may be located between the aluminum layer 105 and copper layer 103 to prevent diffusion. See FIG. 15.

As used herein, the term "on" means in physical contact with. A first structure being "attached" to a second structure can mean that the first structure is directly attached or indirectly attached to the second structure. An encapsulant may "encapsulate" a structure even if the encapsulant does not physically contact the structure.

In one embodiment, an electronic component package includes a package substrate. The package substrate includes a dielectric layer and an aluminum clad copper structure attached to the dielectric layer. The aluminum clad copper structure includes an aluminum bond pad surface. The package includes an electronic component attached to the package substrate. The electronic component includes an electrically conductive structure electrically coupled to the aluminum bond pad surface. The package includes an encapsulant. The encapsulant encapsulating the electronic component and at least a portion of the package substrate. The encapsulant encapsulates the aluminum bond pad surface.

In another embodiment, a method includes attaching an electronic component to a package substrate. The package substrate includes an aluminum clad copper structure having an aluminum bond pad surface. The aluminum clad copper structure is attached to a dielectric layer of the package substrate. The method includes electrically coupling a conductive structure of the electronic component to the aluminum bond pad surface. The method includes encapsulating the electronic component and at least a portion of the package substrate with an encapsulant. The at least a portion includes the aluminum bond pad surface.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method comprising:
attaching an electronic component to a package substrate, the package substrate includes an aluminum clad copper structure having an aluminum bond pad surface, the aluminum clad copper structure is attached to a dielectric layer of the package substrate;
electrically coupling a conductive structure of the electronic component to the aluminum bond pad surface;
encapsulating the electronic component and at least a portion of the package substrate with an encapsulant, the at least a portion including the aluminum bond pad surface;
wherein the aluminum clad copper structure is formed by attaching an aluminum clad copper layer to the dielectric layer and subsequently removing material of the aluminum clad copper layer.

2. The method of claim 1 wherein the aluminum clad copper structure includes an aluminum layer and a copper layer that are attached together under pressure.

3. The method of claim 1 wherein the electrically coupling includes wire bonding a wire including copper to the aluminum bond pad surface.

4. The method of claim 1 wherein the aluminum bond pad surface is a surface of an aluminum layer of the aluminum clad copper structure, the aluminum layer has a thickness of 10 microns or less.

5. The method of claim 1 wherein the package substrate includes a conductive material electrically coupled to the aluminum clad copper structure, wherein the conductive material is formed by plating after the aluminum clad copper layer is attached to the dielectric layer.

6. The method of claim 1 wherein a material of the aluminum clad copper layer is removed by forming a hole through the material of the aluminum clad copper layer and through the dielectric layer.

7. The method of claim 1 wherein aluminum of the aluminum clad copper layer is selectively removed from copper of the aluminum clad copper layer by an etch process with an etchant that is selective to aluminum and not selective to copper.

8. The method of claim 7 wherein after the etch process is performed, copper is plated on a copper surface of the aluminum clad copper layer from which aluminum was removed by the etch process.

9. The method of claim 8 wherein copper material is further removed from the package substrate after the copper is plated.

10. The method of claim 1 wherein the package substrate includes a conductive material electrically coupled to the aluminum clad copper structure, wherein the conductive material is formed by plating.

11. The method of claim 1 wherein the package substrate includes a plurality of vias in the dielectric layer, wherein a conductive material is located in the plurality of vias and is formed by a plating process after the attaching the aluminum clad copper layer to the dielectric layer.

12. The method of claim 1 further comprising:
forming a plurality of solder balls on a side of the package substrate opposite a side of the package substrate where the aluminum bond pad surface is located, wherein a solder ball of the plurality of solder balls is electrically coupled to the aluminum bond pad surface.

13. The method of claim 1 wherein the aluminum clad copper layer is formed by attaching an aluminum layer and a copper layer together by a rolling process.

* * * * *